United States Patent
Takano

(10) Patent No.: US 7,761,748 B2
(45) Date of Patent: Jul. 20, 2010

(54) METHODS AND APPARATUS FOR MANAGING CLOCK SKEW BETWEEN CLOCK DOMAIN BOUNDARIES

(75) Inventor: Chiaki Takano, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 470 days.

(21) Appl. No.: 11/149,103

(22) Filed: Jun. 9, 2005

(65) Prior Publication Data

US 2007/0011531 A1   Jan. 11, 2007

(51) Int. Cl.
| G06K 5/04 | (2006.01) |
| G11B 5/00 | (2006.01) |
| G11B 20/20 | (2006.01) |
| G06F 11/00 | (2006.01) |

(52) U.S. Cl. ................ 714/700; 714/707; 375/226
(58) Field of Classification Search ................ None
See application file for complete search history.

(56) References Cited

U.S. PATENT DOCUMENTS

| 5,428,622 | A | * | 6/1995 | Kuban et al. ................ 714/729 |
| 5,495,486 | A | * | 2/1996 | Gheewala .................... 714/724 |
| 5,719,877 | A | * | 2/1998 | Warren ........................ 714/726 |
| 5,742,617 | A | * | 4/1998 | Warren ........................ 714/726 |
| 5,774,473 | A | * | 6/1998 | Harley ........................... 714/30 |
| 6,122,751 | A | * | 9/2000 | Janssens et al. ............. 713/600 |
| 6,667,645 | B1 | * | 12/2003 | Fletcher et al. ............. 327/200 |
| 6,904,553 | B1 | * | 6/2005 | Brown ......................... 714/731 |
| 6,982,575 | B2 | * | 1/2006 | Stong .......................... 327/141 |
| 6,990,076 | B1 | * | 1/2006 | McNamara et al. ......... 370/241 |
| 2001/0056552 | A1 | * | 12/2001 | Cook et al. .................. 713/500 |
| 2002/0149405 | A1 | * | 10/2002 | Makino ....................... 327/141 |
| 2003/0141908 | A1 | * | 7/2003 | Stong .......................... 327/141 |

FOREIGN PATENT DOCUMENTS

JP     2002312058     10/2002

OTHER PUBLICATIONS

Office Action for corresponding Japanese Patent Application 2006-160821 dated Mar. 10, 2009.

* cited by examiner

*Primary Examiner*—Kevin L Ellis
*Assistant Examiner*—Guerrier Merant
(74) *Attorney, Agent, or Firm*—Matthew B. Dernier, Esq.; Gibson & Dernier LLP

(57) ABSTRACT

Methods and apparatus provide for: a plurality of stages of combinational logic, each stage including a full latch circuit operable to transfer data into the given stage of combinational logic and a transparent latch circuit operable transfer output data from the given stage of combinational logic to a next of the stages; in each stage, passing state changes of output data from the given combinational logic irrespective of when such changes occur when a clock signal of the transparent latch circuit is at a first of two logic levels; and in each stage, withholding state changes of the output data until the clock signal of the transparent latch circuit transitions from the second of the two logic levels to the first logic level.

13 Claims, 5 Drawing Sheets

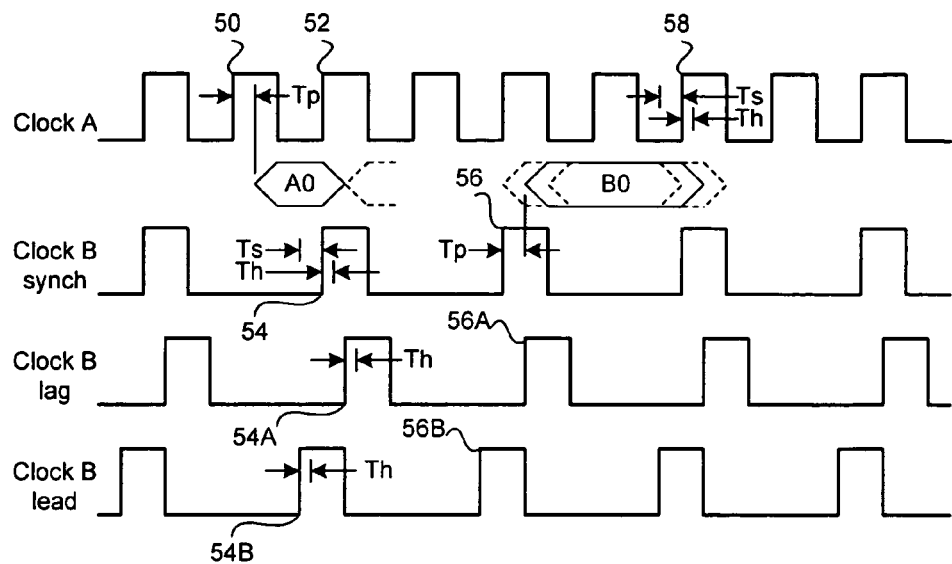
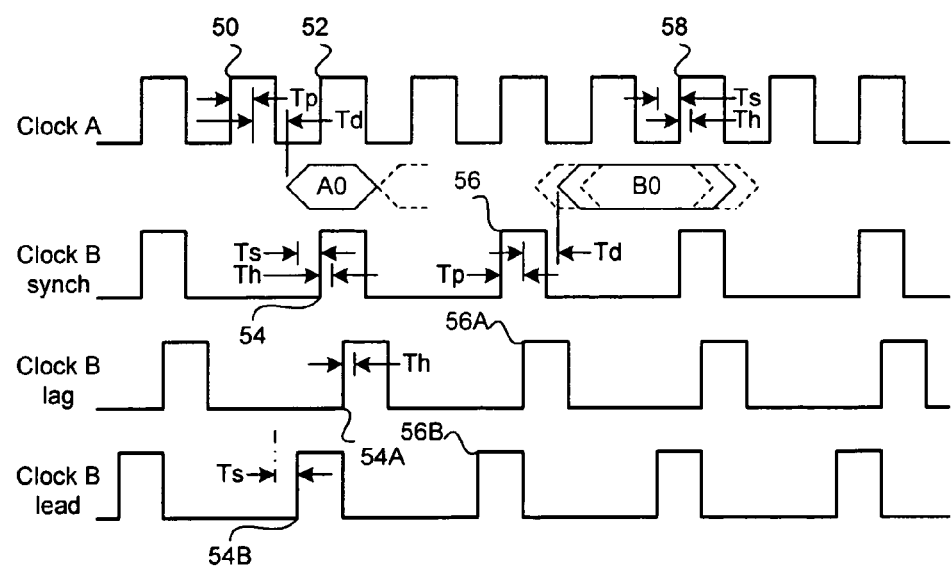

FIG. 4

| INV CLK | IN | OUT |
|---|---|---|
| H | 0 | 0 |
| H | 1 | 1 |
| L | 0 | KEEP |
| L | 1 | KEEP |

METHODS AND APPARATUS FOR MANAGING CLOCK SKEW BETWEEN CLOCK DOMAIN BOUNDARIES

BACKGROUND

The present invention relates to managing clock skew when separate clock domains are employed to process data through a critical path.

In conventional systems, a system clock signal is often used by digital circuitry, such as digital circuitry implemented using a LSI circuit, to synchronously execute certain logic functions. For example, ultra-deep sub-micron (UDSM) microprocessors employ digital circuitry that use system clock signals to synchronously execute logic functions. These microprocessors operate at system clock frequencies of 1 GHz and higher. The system clock signal of a given LSI circuit is often split into many paths to service many different portions of the digital circuitry.

As digital circuits are becoming more complicated, the use of multiple clock frequencies within the circuit is becoming more common. This permits, for example, one portion of the circuit to operate at a lower frequency, thereby reducing power dissipation in the circuit. This may require, however, that data be transferred through a clock domain boundary, i.e., from one portion of circuitry operating at a first frequency to another portion of circuitry operating at a second frequency.

Ideally, the system clock signals at different portions of the digital circuitry exhibit exactly the same timing characteristics so that the different portions of the digital circuitry operate in exact synchronization, even when different clock frequencies are employed in different portions of the circuit. In practice, however, the system clock signals at various points throughout the digital circuitry exhibit differing timing characteristics, such as differing rising and/or falling edges (i.e., transitions), differing duty cycles, and/or differing frequencies. These non-ideal characteristics are often referred to as clock jitter and clock skew.

Clock jitter relates to the inaccuracies inherent in generating the system clock signal. The non-ideal characteristics of the system clock signals due to clock jitter affect all portions of the LSI circuit in the same way, irrespective of how the system clock signals are distributed to those portions of the circuit. Clock skew relates to the inaccuracies introduced into the system clock signals by the distribution technique employed to split the system clock into many paths and deliver the clock signals to different portions of the digital circuit.

Sources of clock skew may be classified as being statically occurring or dynamically occurring. Statically occurring sources of clock skew are caused by the LSI design or manufacturing process irrespective of the operating conditions of the LSI circuit. Dynamically occurring sources of clock skew are caused by the operating conditions of the LSI circuit, which may also be functions of the LSI circuit design or manufacturing process.

Statically occurring sources of clock skew include (i) variations in transistor load capacitance (e.g., gate load capacitance); (ii) RC delay of circuit interconnections (e.g., the asymmetry of wire lengths and widths); (iii) variations and/or asymmetries in cross-coupling capacitance between wires (e.g., inter-wiring capacitance); and (iv) semiconductor process variations (e.g., transistor threshold voltage variations, transistor ON resistance variations, wiring variations, via, and contact RC variations).

Dynamically occurring sources of clock skew include (i) cross-coupling between wire lengths due to inter-wiring capacitance; (ii) cross-coupling between wire lengths due to inductive coupling; (iii) cross-coupling due to return path current; (iv) temperature variations; and (v) variations in VDD and VSS (e.g., DC operating voltage variations).

Unfortunately, the variations in the timing characteristics of the system clock signals due to clock skew result in undesirable errors in the operation of the digital circuitry of the LSI circuit. The problem is exacerbated when transitions through clock domain boundaries are encountered.

The above difficulties due to clock skew will now be discussed in more detail with reference to FIGS. 1 and 2A-B. FIG. 1 is a block diagram of a digital system 10 employing clock domain boundaries between respective stages of combinational logic. The system 10 includes a plurality of full latch circuits 12, 16, 20 and a plurality of combinational logic circuits 14, 18. (For the purposes of the present discussion, the delay circuits 22, 24 are assumed not to be within the system 10.) The full latch circuit 12 is operable to transfer data into a first stage of combinational logic 14, while the full latch circuit 16 is operable to transfer data into a second stage of combinational logic 18. The full latch circuit 12 is clocked utilizing a clock A operating at a first frequency (e.g., 4 GHz). The full latch circuit 16 is clocked utilizing clock B operating at a second frequency (e.g., 2 GHz). Thus, the full latch circuit 16 establishes a clock domain boundary between the first stage of combinational logic 14 and the second stage of combinational logic 18, which stages operate at different frequencies.

It is understood that the system 10 may include further stages of combinational logic that are not shown for the purposes of brevity and clarity.

FIG. 2A is a graph illustrating the timing characteristics of the clock A signals and the clock B signals as they relate to the availability and transfer of valid data between the first and second stages of combinational logic 14, 18. Initial reference will be made to the clock A signal and the clock B (synch) signal, where the clock B (synch) signal represents the ideal case where the rising edges of the clock A signal and the clock B (synch) signal are exactly aligned. On the rising edge 50 of the clock A signal, the full latch circuit 12 clocks data into the combinational logic 14. The shortest propagation delay Tp exists from the rising edge 50 of the clock A signal to the onset of valid output data A0 from the combinational logic 14. The data A0 is valid until the shortest propagation delay Tp following a next rising edge 52 of the clock A signal.

At the rising edge 54 of the clock B (synch) signal, the full latch circuit 16 will transfer the data at its input (which may include data A0) to the combinational logic 18. The set-up time Ts for the full latch circuit 16 represents an amount of time prior to the rising edge 54 of the clock B (synch) signal during which the data A0 must be valid at the input of the full latch circuit 16 in order for proper transfer to occur. The hold time Th represents an amount of time following the rising edge 54 of the clock B (synch) signal during which the output data A0 must remain valid at the input of the full latch circuit 16 for proper transfer to occur.

Since there is always some minimal propagation delay Tp following the rising edges 50, 52 of the clock A signal before the validity of the data in the first stage of combinational logic 14 changes, there is typically no hold time violation when the clock B signal is synchronized with the clock A signal.

A similar analysis obtains when considering the data transfer from the second stage of combinational logic 18 to a next stage represented by latch 20. In particular, the rising edge 56 of the clock B (synch) signal clocks the data at the input of the full latch circuit 16 into the combinational logic 18. After a shortest propagation delay Tp following the rising edge 56, the output data B0 of the combinational logic 18 becomes valid at the input of the full latch circuit 20.

At the rising edge 58 of the clock A signal, the full latch circuit 20 will transfer the data at its input (which may include data B0) to the combinational logic of the next stage (not shown). The set-up time Ts for the full latch circuit 20 represents an amount of time prior to the rising edge 58 of the clock A signal during which the output data B0 must be valid at the input of the full latch circuit 20 in order for proper transfer to occur. The hold time Th represents an amount of time following the rising edge 58 of the clock A signal during which the output data B0 must remain valid at the input of the full latch circuit 20 for proper transfer to occur.

Referring now to the clock B (lag) signal, it is assumed that the clock B signal lags the clock A signal due to clock skew problems. Under this scenario, the lagging rising edge 54A of the clock B (lag) signal occurs a significant time later than the rising edge 54 of the clock B (synch) signal. When this lag is of significant magnitude, the output data A0 may not be valid for a significant length of time to meet the hold time Th following the lagging rising edge 54A. Consequently, the valid output data A0 may never be transferred into the second stage of combinational logic 18. Indeed, although the set-up time Ts prior to the rising edge 54A of the full latch circuit 16 may be satisfied, the validity of the output data A0 expires prior to the hold time Th following the rising edge 54A. Consequently, the full latch circuit 16 cannot transfer the valid output data A0 from the combinational logic 14 to the combinational logic 18.

With respect to the transfer of the output data B0 from the combinational logic 18 to a next stage, the clock B (lag) signal actually assists in providing an additional amount of time in which the output data B0 is valid following the expiration of the hold time Th following the rising edge 58 of the clock A signal. Notably, however, the lagging nature of the clock B (lag) signal reduces the set-up time—an amount of time in which the output data B0 is valid prior to the rising edge 58. In this example, this reduction will likely not violate the set-up time Ts requirement prior to the rising edge 58 for the full latch circuit 20.

Turning now to the details of the clock B (lead) signal, it is assumed that the rising edges of the clock B (lead) signal occur before the rising edges of the clock A signal. As to the output data A0, the leading nature of the clock B (lead) signal assists in providing hold time—a period of time in which the output data A0 is valid following the rising edge 54B of the clock B (lead) signal. Thus, the leading nature of the clock B (lead) signal would not appear to cause hold time problems as to the transfer of the output A0 from the first stage of combinational logic circuit 14 to the second state of combinational logic 18. Notably, however, the leading nature of the clock B (lead) signal reduces the set-up time—an amount of time in which the output data A0 is valid prior to the rising edge 54B of the clock B (lead) signal. Thus, it is possible that set-up time problems might occur depending on the severity of the leading characteristics of the clock B (lead) signal.

The leading rising edge 56B of the clock B (lead) signal occurs a significant time before the rising edge 56 of the clock B (synch) signal. When this lead is of significant magnitude, the output data B0 may not be valid for a significant length of time to meet the hold time Th following the rising edge 58 of the clock A signal. Consequently, the valid output data B0 may never be transferred into the next stage of combinational logic. Indeed, although the set-up time Ts prior to the rising edge 58 of the full latch circuit 20 may be satisfied, the validity of the output data B0 expires prior to the hold time Th following the rising edge 58 of the clock A signal. Consequently, the full latch circuit 20 cannot transfer the valid output data B0 from the combinational logic 18 to the next stage.

A conventional solution to the hold time violation problems resulting from the clock skew phenomenon as between the clock A and clock B signals is to employ the delay circuits 22, 24 somewhere in the respective data paths of the combinational logic 14 and the combinational logic 18. For the purposes of discussion, the delay circuits 22, 24 are illustrated as being inserted just prior to the respective full latch circuits 16, 20. With reference to FIG. 2B, the introduction of the delay circuit 22 delays the propagation of the output data A0 by an amount Td following the propagation delay Tp from the rising edge 50 of the clock A signal. This insures that the output data A0 is valid for an additional time period, Td, following the rising edge 54A of the clock B (lag) signal. Thus, the hold time Th for the full latch circuit 16 may be met and the output data A0 may be transferred to the second stage of combinational logic 18.

The introduction of the delay circuit 24 prior to the full latch circuit 20 introduces an amount of delay Td following the propagation delay Tp measured from the rising edge 56A of the clock B (lag) signal before the output data B0 from the combinational logic 18 is valid. Consequently, the amount of time margin as between the onset of the valid output data B0 to the beginning of the set-up time Ts before the rising edge 58 of the clock A signal is significantly reduced.

When the clock B signal leads the clock A signal, the effect of the delay circuit 22 on the validity of the output data A0 tends to cause set-up time Ts violations as to the full latch circuit 16 measured with respect to the rising edge 54B of the clock B (lead) signal. The leading characteristics of the clock B (lead) signal may tend to improve the set-up time characteristics as to the validity of the output data B0 with respect to the full latch circuit 20 and the rising edge 58 of the clock A signal, but the delay introduced by the delay circuit 24 negates such improvements. The introduction of the delay circuit 24 may increase the amount of time that the output data B0 is valid following the rising edge 58 of the clock A signal, thereby satisfying the hold time Th for the full latch circuit 20.

Although the use of delay circuits to address hold time problems may be useful, there is a corresponding increase in the likelihood of set-up time violations. Further, they consume a significant amount of the overall timing budget of the critical paths through the respective stages of combinational logic. Theoretically, the total amount of delay introduced into a particular stage due to the delay circuits and the clock skew should be two times the maximum clock skew. This may significantly increase the occurrence of set-up time violations and also significantly reduce the timing margins of the overall system.

SUMMARY OF THE INVENTION

In accordance with one or more embodiments of the present invention, an apparatus includes: at least first and second stages of combinational logic; first and second full latch circuits operable to transfer data into the first and second stages of combinational logic, respectively; and a first transparent latch circuit operable transfer output data from the first stage of combinational logic to the second full latch circuit.

The apparatus may further include a second transparent latch circuit operable transfer output data from the second stage of combinational logic. The first full latch circuit is preferably clocked with a first clock signal and the first transparent latch circuit is preferably clocked with an inverted first clock signal. Similarly, the second full latch circuit may be clocked with a second clock signal and the second transparent latch circuit may be clocked with an inverted second clock signal. Preferably, the first clock signal is at a higher frequency than the second clock signal.

The apparatus may further include a plurality of stages of combinational logic, each stage including a full latch circuit operable to transfer data into the given stage of combinational logic and a transparent latch circuit operable transfer output data from the given stage of combinational logic to a next of the stages. Preferably, the full latch circuit and the transparent latch circuit of each stage are clocked with inverted versions of a common clock signal. The adjacent stages may be clocked at different frequencies.

It is noted that at least one of the stages of combinational logic may include a plurality of branches of digital logic gates, where each branch operates on a respective input stream of data to produce a respective output stream of data. Therefore, the full latch circuit of the at least one stage of combinational logic preferably includes a plurality of flip flops, where each flip flop transfers the input stream of data into the stage. Similarly, the transparent latch circuit of the at least one stage of combinational logic preferably includes a plurality of half latches, where each half latch transfers the output stream of data into a next of the stages.

The first transparent latch is preferably operable to: (i) pass state changes of the output data from the given combinational logic irrespective of when such changes occur when a clock signal of the first transparent latch is at a first of two logic levels; and (ii) withhold state changes of the output data until the clock signal of the first transparent latch transitions from the second of the two logic levels to the first logic level.

In accordance with one or more further embodiments of the present invention, an apparatus includes a plurality of stages of combinational logic, each stage including a full latch circuit operable to transfer data into the given stage of combinational logic and a transparent latch circuit operable transfer output data from the given stage of combinational logic to a next of the stages.

In accordance with one or more further embodiments of the present invention, a method includes: providing a plurality of stages of combinational logic, each stage including a full latch circuit operable to transfer data into the given stage of combinational logic; in each stage, passing state changes of output data from the given combinational logic irrespective of when such changes occur when a clock signal of the full latch circuit is at a first of two logic levels; and in each stage, withholding state changes of the output data until the clock signal of the full latch circuit transitions from the second of the two logic levels to the first logic level.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIGS. 2A-B are timing diagrams illustrating relationships between the clock signals and data validity characteristics of the system of FIG. 1 with and without clock skew;

FIG. 4 is a diagram of a truth table for a transparent latch in accordance with one or more embodiments of the present invention;

DETAILED DESCRIPTION OF THE PRESENT INVENTION

Figure 1:
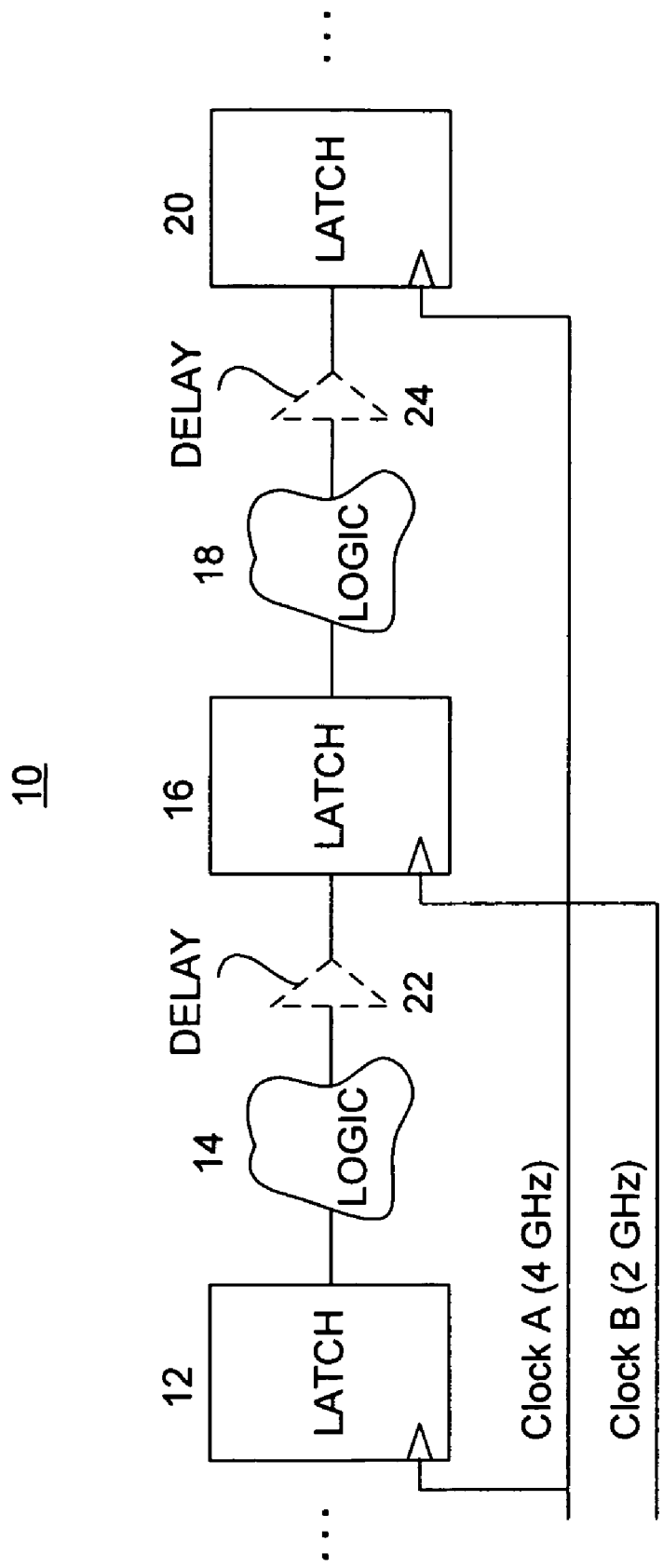
FIG. 1 is a block diagram of a system employing clock boundaries between respective stages of combinational logic in accordance with the prior art.
Figure 3:
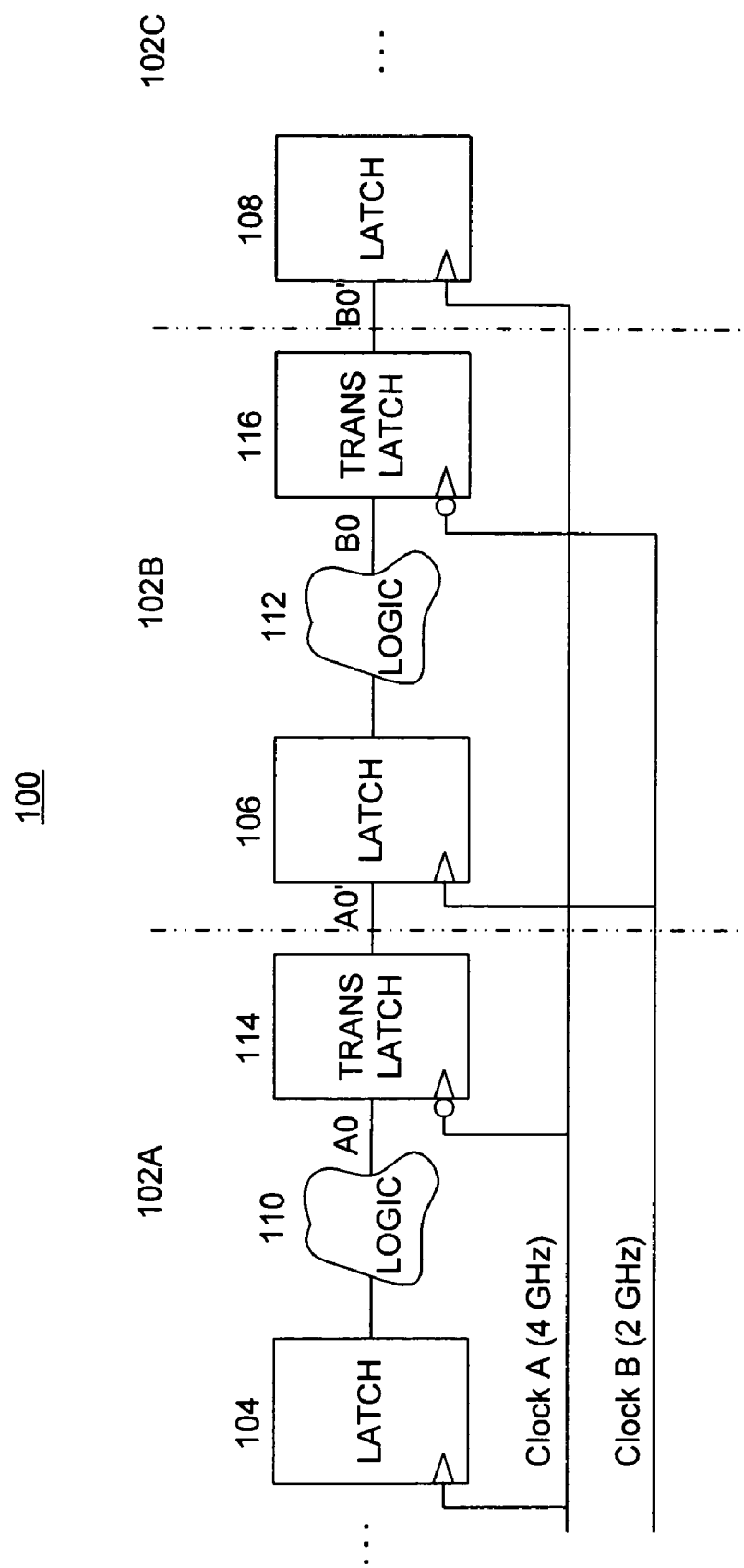
FIG. 3 is a block diagram of a system employing clock boundaries between respective stages of combinational logic in accordance with one or more embodiments of the present invention.

With reference to the drawings, wherein like numerals indicate like elements, there is shown in FIG. 3 a digital system 100 in accordance with one or more embodiments of the present invention. The system 100 includes a plurality of stages of 102A, 102B, 102C . . . , where each stage 102 includes combinational logic 110 or 112, that is operable to manipulate digital data in a desirable way. The system 100 also includes a plurality of full latch circuits 104, 106. The full latch circuit 104 is operable to transfer data into a first stage of combinational logic 110, while the full latch circuit 106 is operable to transfer data into a second stage of combinational logic 112. The full latch circuit 104 is clocked utilizing a clock A operating at a first frequency (e.g., 4 GHz). The full latch circuit 106 is clocked utilizing clock B operating at a second frequency (e.g., 2 GHz). Thus, the full latch circuit 106 establishes a clock domain boundary between the first stage 102A and the second stage 102B, which stages operate at different frequencies. It is noted that there is preferably a relationship between clock A and clock B, such as that clock A frequency is an integer multiple of clock B frequency or that clock B frequency is an integer multiple of clock A frequency.

It is understood that the system 100 may include further stages of combinational logic that are not shown for the purposes of brevity and clarity.

Figure 4:
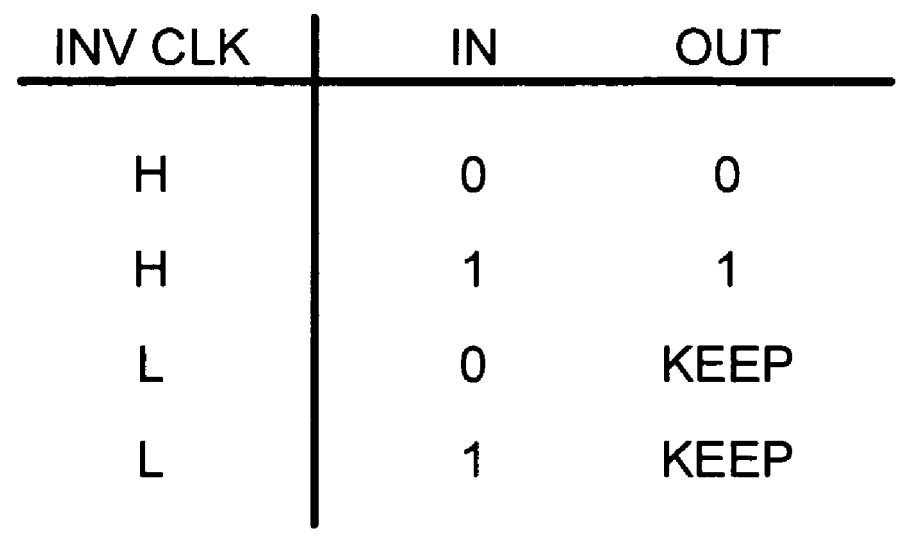

Each stage 102 also preferably includes a transparent latch, where stage 102A includes transparent latch circuit 114, stage 102B includes transparent latch circuit 116, etc. With reference to FIG. 4, each transparent latch circuit preferably operates in accordance with a truth table in which the latch is operable to pass state changes of the data input thereto irrespective of when such changes occur so long as the clock signal of the transparent latch is at a first of two logic levels. In the truth table shown in FIG. 4, the first logic level may be a logic high while the second logic level may be a logic low. The transparent latch also preferably withholds state changes of the data input thereto until the clock signal transitions from the second logic level to the first logic level. Thus, while a state change from logic low-high or logic high-low may pass through the transparent latch substantially instantaneously when the clock signal is at the first (e.g., high) level, the state change is "kept" when the clock signal is at the second (e.g., low) level until such clock signal transitions to the first logic. Those skilled in the art will appreciate that this truth table is sometimes referred to as a "half latch" arrangement.

It is noted that for simplicity, the combinational logic 110, 112, etc. of each stage may include a plurality of branches of digital logic gates, where each branch operates on a respective input stream of data to produce a respective output stream of data. For simplicity, however, a single line is shown as being input to each stage of combinational logic 110, 112 and one line is shown leaving each stage. Assuming, however, that multiple branches of digital logic may exist within each stage of combinational logic, it is understood that the full latch circuit 104, 106, 108, etc. and the transparent latch circuits 114, 116, etc. may be implemented utilizing a plurality of such latch circuits to accommodate each branch of the digital logic within the respective combinational logic circuits. For example, the full latch circuit 104 may be implemented utilizing an array of flip flops (FIFOs) that operate to transfer data into the respective branches of digital logic gates forming the combinational logic 110. Similarly, the transparent latch circuit 114 may be implemented utilizing a plurality of half latch circuits, where each half latch circuit is operable to transfer respective output data from the branches of digital logic gates of the combination logic 110 to the input(s) of the full latch circuit 106. Similar details may apply to the other stages of the system 100.

Notably, the full latch circuit and the transparent latch circuit of each stage 102 are clocked with inverted versions of the respective clock signal. Thus, the full latch circuit 104 is clocked with clock A while the transparent latch circuit 114 of the first stage 102A is clocked with an inverted version of the clock A. Similarly, the full latch circuit 106 is clocked with the clock B, while the transparent latch circuit 116 is clocked with an inverted version of the clock B. Preferably, this clocking arrangement is consistent with other stages (if any). It is also preferred that adjacent stages are clocked at different frequencies. In keeping with the example above, the first stage 102A is clocked at 4 GHz while the second stage 102B is clocked at 2 GHz.

Figure 5:
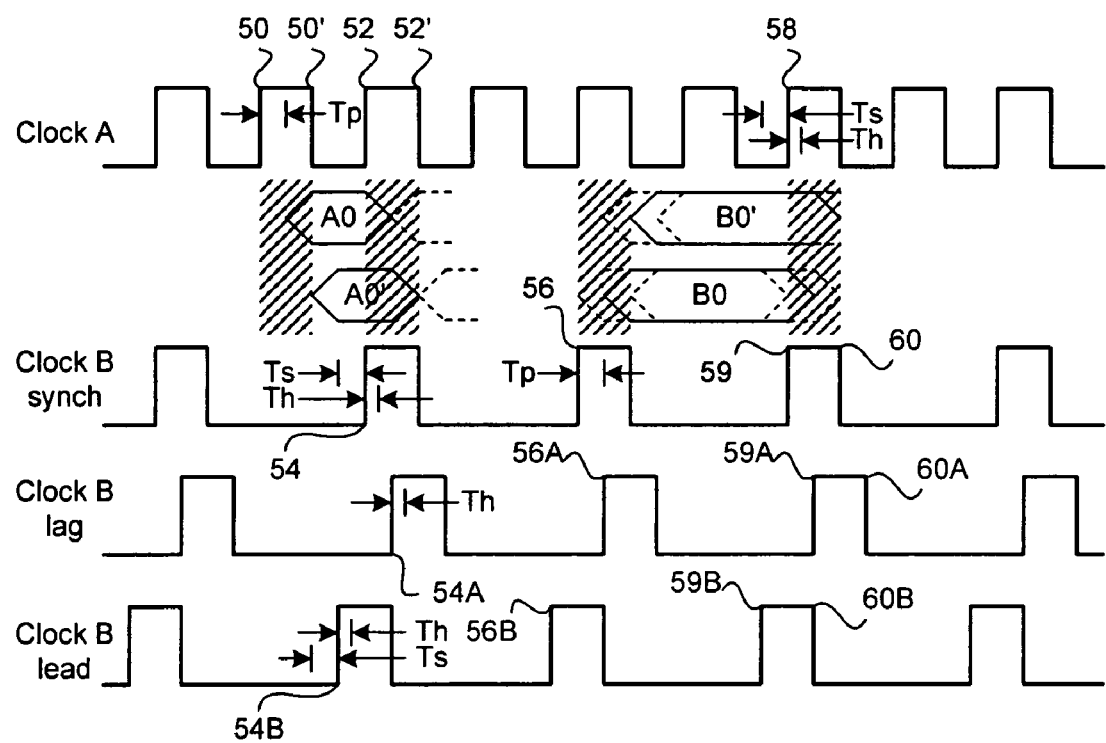
FIG. 5 is a timing diagram illustrating relationships between the clock signals and data validity characteristics of the system of FIG. 3 with and without clock skew.

The operation of the system 100 will now be described in more detail with reference to FIG. 5, which is a graph illustrating the timing characteristics of the respective clock signals as compared with the transfer of data into and out of each stage of the system 100. Initial reference will be made to the clock A signal and the clock B (synch) signal, where the clock B (synch) signal represents the ideal case where the rising edges of the clock A signal and the clock B (synch) signal are exactly aligned. On the rising edge 50 of the clock A signal, the full latch circuit 104 clocks data into the combinational logic 110. The shortest propagation delay Tp exists from the rising edge 50 of the clock A signal to the onset of valid output data A0 from the combinational logic 110. The data A0 is valid until the shortest propagation delay Tp following a next rising edge 52 of the clock A signal.

At the rising edge 54 of the clock B (synch) signal, the full latch circuit 106 will transfer the data at its input to the combinational logic 112. The set-up time Ts for the full latch circuit 106 represents an amount of time prior to the rising edge 54 of the clock B (synch) signal during which the data A0 must be valid at the input of the full latch circuit 106 in order for proper transfer to occur. The hold time Th represents an amount of time following the rising edge 54 of the clock B (synch) signal during which the output data A0 must remain valid at the input of the full latch circuit 106 for proper transfer to occur.

Since there is always some minimal propagation delay Tp following the rising edges 50, 52 of the clock A signal before the validity of the data in the first stage of combinational logic 110 changes, there is typically no hold time violation when the clock B signal is synchronized with the clock A signal.

A similar analysis obtains when considering the data transfer from the second stage of combinational logic 112 to a next stage represented by latch 108. In particular, the rising edge 56 of the clock B (synch) signal clocks the data at the input of the full latch circuit 106 into the combinational logic 112. After a shortest propagation delay Tp following the rising edge 56, the output data B0 of the combinational logic 112 becomes valid at the input of the full latch circuit 116.

At the rising edge 58 of the clock A signal, the full latch circuit 108 will transfer the data at its input (which may include data B0) to the combinational logic of the next stage (not shown). The set-up time Ts for the full latch circuit 108 represents an amount of time prior to the rising edge 58 of the clock A signal during which the output data B0 must be valid at the input of the full latch circuit 108 in order for proper transfer to occur. The hold time Th represents an amount of time following the rising edge 58 of the clock A signal during which the output data B0 must remain valid at the input of the full latch circuit 108 for proper transfer to occur.

Referring now to the clock B (lag) signal, it is assumed that the clock B signal lags the clock A signal due to clock skew problems. Under this scenario, the lagging rising edge 54A of the clock B (lag) signal occurs a significant time later than the rising edge 54 of the clock B (synch) signal. When this lag is of significant magnitude, the output data A0 may not be valid for a significant length of time to meet the hold time Th following the lagging rising edge 54A. Consequently, the valid output data A0 may never be transferred into the second stage of combinational logic 112. Indeed, although the set-up time Ts prior to the rising edge 54A of the full latch circuit 16 may be satisfied, the validity of the output data A0 expires prior to the hold time Th following the rising edge 54A. Consequently, the full latch circuit 106 cannot transfer the valid output data A0 from the combinational logic 110 to the combinational logic 112.

While the output data from the combinational logic 110 is labeled A0, the effect that the transparent latch circuit 114 has on output data A0 is labeled A0'. Similarly, the output data of the combinational logic 112 is labeled B0, while the effect that the transparent latch circuit 116 has on such data is labeled B0'. In keeping with the description of the operation of transparent latch circuits provided above, although the state of the output data A0 from the combinational logic 110 may change and become valid after expiration of the propagation Tp, the transparent latch 114 withholds any state changes of the output data A0 while the inverted clock A signal is low. Thus, the output data A0' becomes valid when the clock A signal transitions from a high logic level to a low logic level at 50'. Similarly, despite that the state of the output data A0 may change after the rising edge 52 of the clock A signal, the transparent latch circuit 114 will maintain the state of the output signal A0' during the time that the clock signal A is at a logic high and the inverted clock A signal is at a logic low and permit the state of the output signal A0' to transition when the state of the inverted clock A signal transitions from logic low to logic high at 52'.

Consequently, when the clock B signal lags behind the clock A due to clock skew, the transparent latch circuit 114 maintains the valid state of the output data A0' for a sufficient time to meet the hold time Th following the rising edge 54A of the clock B (lag) signal. Furthermore, the transparent latch circuit 114 does not shift the timing of the output data A0' by such an extent as to violate the set up time Ts prior to the rising edge 54B of the clock B (lead) signal.

With respect to the transfer of the output data B0 from the combinational logic 112 to a next stage, the clock B (lag) signal actually assists in providing an additional amount of time in which the output data B0 is valid following the expiration of the hold time Th following the rising edge 58 of the clock A signal. Notably, however, the lagging nature of the clock B (lag) signal reduces the set-up time—an amount of time in which the output data B0 is valid prior to the rising edge 58. In this example, this reduction will likely not violate the set-up time Ts requirement prior to the rising edge 58 for the full latch circuit 108.

When the full latch circuit 106 transfers data into the combinational logic 112 at the rising edge 56 of the clock B signal, the transparent latch circuit 116 withholds the state of the output data B0' prime until the logic state of the inverted clock B signal transitions from low to high. Similarly, the transparent latch circuit 116 holds the state of the output data signal B0' while the state of the inverted clock B signal is low between edges 59 and 60.

Turning now to the details of the clock B (lead) signal, it is assumed that the rising edges of the clock B (lead) signal occur before the rising edges of the clock A signal. As to the output data A0, the leading nature of the clock B (lead) signal assists in providing hold time—a period of time in which the output data A0 is valid following the rising edge 54B of the clock B (lead) signal. Thus, the leading nature of the clock B (lead) signal would not appear to cause hold time problems as to the transfer of the output A0 from the first stage of combinational logic circuit 110 to the second state of combinational logic 112. Notably, however, the leading nature of the clock B (lead) signal reduces the set-up time—an amount of time in which the output data A0 is valid prior to the rising edge 54B of the clock B (lead) signal. Thus, it is possible that set-up time problems might occur depending on the severity of the leading characteristics of the clock B (lead) signal.

The leading rising edge 56B of the clock B (lead) signal occurs a significant time before the rising edge 56 of the clock B (synch) signal. When this lead is of significant magnitude, the output data B0 may not be valid for a significant length of time to meet the hold time Th following the rising edge 58 of the clack A signal. Consequently, the valid output data B0 may never be transferred into the next stage of combinational logic. Indeed, although the set-up time Ts prior to the rising edge 58 of the full latch circuit 108 may be satisfied, the validity of the output data B0 expires prior to the hold time Th following the rising edge 58 of the clock A signal. Consequently, the full latch circuit 108 cannot transfer the valid output data B0 from the combinational logic 112 to the next stage.

Notably, when the clock B (lead) signal is exhibited due to clock skew, the transparent latch circuit 116 withholds the state change of the output data B0' until the transition of the inverted clock B (lead) signal from low to high at edge 60B. Therefore, the hold time Th of the full latch circuit 108 is met after rising edge 58 of the clock A signal. It is also noted that this traversal of the hold time problem is achieved without sacrificing as much of the set up time margin as was exhibited by the prior art delay circuit implementation (FIG. 2B).

Advantageously, the circuit implementation illustrated in FIG. 3 and in accordance with one or more embodiments of the present invention, significantly addresses the issue of clock skew with relatively little impact on the set up time margins. This represents a significant advancement over the characteristics of the prior art approach discussed hereinabove.

It is noted that the methods and apparatus described thus far and/or described later in this document may be achieved utilizing any of the known technologies, such as standard digital circuitry, analog circuitry, microprocessors, digital signal processors, any of the known processors that are operable to execute software and/or firmware programs, programmable digital devices or systems, programmable array logic devices, or any combination of the above, including devices now available and/or devices which are hereinafter developed.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   at least first and second stages of combinational logic;
   first and second full latch circuits operable to transfer data into the first and second stages of combinational logic, respectively; and
   a first transparent latch circuit operable to transfer output data from the first stage of combinational logic to the second full latch circuit;
   a second transparent latch circuit operable transfer output data from the second stage of combinational logic to a subsequent stage, wherein
   the first full latch circuit and the first transparent latch circuit are clocked with a first clock signal, and
   the second full latch circuit and the second transparent latch circuit are clocked with a second clock signal, the first and second clock signals being of differing frequencies.

2. The apparatus of claim 1, wherein the first full latch circuit is clocked with the first clock signal and the first transparent latch circuit is clocked with an inverted version of the first clock signal.

3. The apparatus of claim 2, wherein the second full latch circuit is clocked with the second clock signal and the second transparent latch circuit is clocked with an inverted version of the second clock signal.

4. The apparatus of claim 1, wherein the first clock signal is at a higher frequency than the second clock signal.

5. The apparatus of claim 1, further comprising a plurality of stages of combinational logic, each stage including a full latch circuit operable to transfer data into the given stage of combinational logic and a transparent latch circuit operable transfer output data from the given stage of combinational logic to a next of the stages.

6. The apparatus of claim 5, wherein the full latch circuit and the transparent latch circuit of each stage are clocked with inverted versions of a common clock signal.

7. The apparatus of claim 5, wherein adjacent stages are clocked at different frequencies.

8. The apparatus of claim 1, wherein:
   at least one of the stages of combinational logic include a plurality of branches of digital logic gates, each branch operating on a respective input stream of data to produce a respective output stream of data;
   the full latch circuit of the at least one stage of combinational logic includes a plurality of flip flops, each flip flop transferring the input stream of data into the stage; and
   the transparent latch circuit of the at least one stage of combinational logic includes a plurality of half latches, each half latch transferring the output stream of data into a next of the stages.

9. The apparatus of claim 1, wherein the first transparent latch is operable to: (i) pass state changes of the output data from the first stage of combinational logic irrespective of when such changes occur when a clock signal of the first transparent latch is at a first of two logic levels; and (ii) withhold state changes of the output data until the clock signal of the first transparent latch transitions from the second of the two logic levels to the first logic level.

10. An apparatus, comprising:
a plurality of stages of combinational logic, each stage including a full latch circuit operable to transfer data into the given stage of combinational logic and a transparent latch circuit operable to transfer output data from the given stage of combinational logic to a next of the stages; wherein
the full latch circuit and the transparent latch circuit of each stage are clocked with a respective common clock signal, and
the full latch circuit and the transparent latch circuit of immediately adjacent stages are clocked with clock signals of differing frequencies.

11. The apparatus of claim 10, wherein: the full latch circuit and the transparent latch circuit of each stage are clocked with inverted versions of the common clock signal.

12. The apparatus of claim 10, wherein the transparent latch circuits are operable to: (i) pass state changes of output data from the given combinational logic irrespective of when such changes occur when a clock signal of the transparent latch circuit is at a first of two logic levels; and (ii) withhold state changes of the output data until the clock signal of the transparent latch circuit transitions from the second of the two logic levels to the first logic level.

13. A method, comprising:
providing a plurality of stages of combinational logic, each stage including a full latch circuit operable to transfer data into the given stage of combinational logic and a transparent latch circuit operable to transfer the data out of the given stage of combinational logic;
in each stage, passing state changes of output data from the given combinational logic irrespective of when such changes occur when a clock signal of the full latch circuit is at a first of two logic levels;
in each stage, withholding state changes of the output data until the clock signal of the full latch circuit transitions from the second of the two logic levels to the first logic level; and
driving the full latch circuit and the transparent latch circuit of each given stage with a respective common clock signal, and the full latch circuit and the transparent latch circuit of immediately adjacent stages are clocked with clock signals of differing frequencies.

* * * * *